(12) United States Patent
Poh (10) Patent No.: US 8,335,070 B2
(45) Date of Patent: Dec. 18, 2012

(54) ELECTROSTATIC-TYPE REINFORCEMENT APPARATUS

(75) Inventor: Fow-Lai Poh, Kawachi-gun (JP)

(73) Assignee: Tsukuba Seiko Ltd., Kawachi (JP)

( * ) Notice: Subject to any disclaimer, the term of this patent is extended or adjusted under 35 U.S.C. 154(b) by 314 days.

(21) Appl. No.: 12/734,145

(22) PCT Filed: Oct. 10, 2008

(86) PCT No.: PCT/JP2008/068477
§ 371 (c)(1),
(2), (4) Date: Apr. 28, 2010

(87) PCT Pub. No.: WO2009/051079
PCT Pub. Date: Apr. 23, 2009

(65) Prior Publication Data
US 2010/0309603 A1 Dec. 9, 2010

(30) Foreign Application Priority Data
Oct. 15, 2007 (JP) .................................. 2007-268047

(51) Int. Cl.
*H01L 21/683* (2006.01)
*H01T 23/00* (2006.01)
(52) U.S. Cl. ...................................................... 361/234
(58) Field of Classification Search .................... 361/234
See application file for complete search history.

(56) References Cited

U.S. PATENT DOCUMENTS
5,258,047 A 11/1993 Tokisue et al.
7,821,767 B2 * 10/2010 Fujii .............................. 361/234

FOREIGN PATENT DOCUMENTS

| JP | A 4-206545 | 7/1992 |
|----|------------|--------|
| JP | A 5-315429 | 11/1993 |
| JP | A 8-274153 | 10/1996 |
| JP | A 9-64160 | 3/1997 |
| JP | A 2001-319906 | 11/2001 |
| JP | A 2003-282671 | 10/2003 |
| JP | A 2004-47511 | 2/2004 |
| JP | A 2004-358562 | 12/2004 |
| JP | A 2006-40993 | 2/2006 |
| JP | A 2006-52075 | 2/2006 |

OTHER PUBLICATIONS

International Search Report issued for International Application No. PCT/JP2008/068477 on Dec. 16, 2008 (w/translation).

* cited by examiner

*Primary Examiner* — Dharti Patel
(74) *Attorney, Agent, or Firm* — Oliff & Berridge, PLC (57) ABSTRACT

A reinforcement apparatus is for reinforcing a thin plate-like reinforcement object which is required to be temporarily reinforced in operating processes. The electrostatic-type reinforcement apparatus includes a reinforcement material body including a thin plate type electrostatic holding part formed by burying an electrode part into an electric insulating layer, and a voltage controller constituted to be separated from the reinforcement material body and having a first connecting terminal configured to allow an reinforcement object conducted to an earth and a second connecting terminal configured to allow the electrode part to be conducted to an earth or a high voltage. The voltage controller includes an attracting process part configured to attract the reinforcement object by generating an attraction force in the electrostatic holding part by supplying an electric charge of a reverse polarity to the charges supplied to the electrode part to the reinforcement object from the earth and an attraction releasing process part configured to cancel an electrostatic attracting ability by releasing charges stored in the reinforcing object and the electrode part from the earth.

6 Claims, 6 Drawing Sheets

PRIOR ART

FIG.6B

PRIOR ART

ELECTROSTATIC-TYPE REINFORCEMENT APPARATUS

TECHNICAL FIELD

The present invention relates to an electrostatic-type reinforcement apparatus which suppresses a stress generated on a thin film material such as a silicon wafer.

BACKGROUND ART

Recently, a thinned and large-area silicone wafer has been developed. Such a thin silicone wafer is breakable, and when being stressed in handling, cracks or micro-cracks are generated so that performance of a silicone wafer is degraded to reduce the quality and defective products are increased.

In order to prevent the cracks or micro cracks on the silicone wafer from being generated, a wafer protective tape has been developed (for example, see Patent Document 1).

Figure 6A:
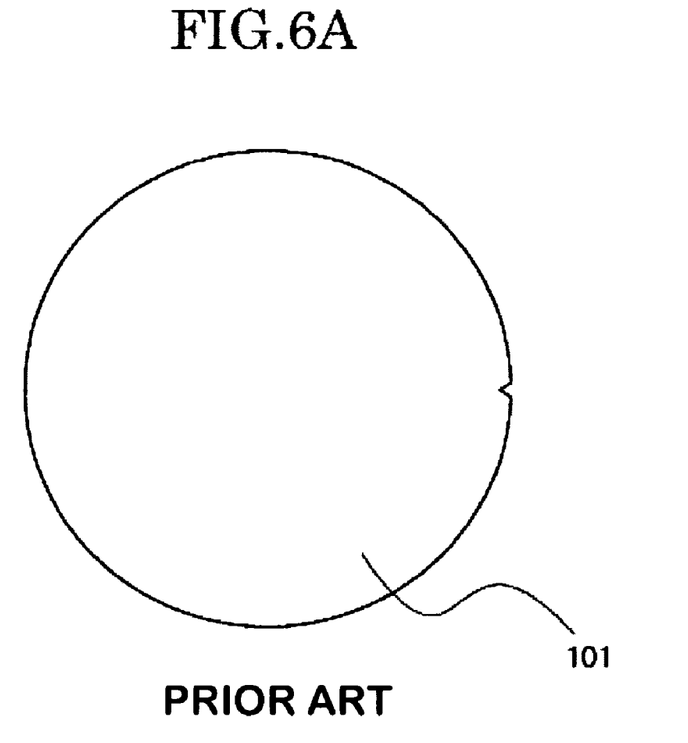
[FIG. 6A]0 A plain view of a conventional tape-type reinforcement apparatus.
Figure 6B:
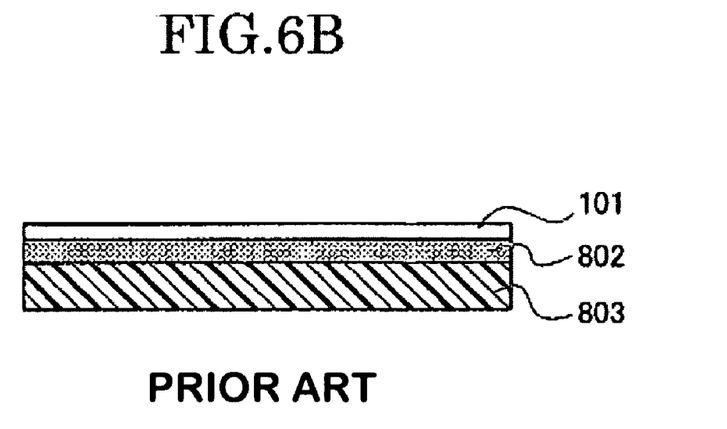
[FIG. 6B] A sectional view of a conventional tape-type reinforcement apparatus.

The wafer protective tape 800 is, as shown in FIG. 6, constituted by applying an adhesive or a bonding adhesive 802 on one surface of a tape-like supporter 803. A tape-like supporter is attached on the silicone wafer via the adhesive 802 and a silicone wafer 101 is protected by the tape-like supporter from a back side. When the protection is unnecessary, the wafer protection tape 800 is released by use of a protection tape releasing apparatus, or the like and then scrapped.

By use of such a wafer protection tape 800, even if the silicon wafer 101 to be thinly polished is used, it is reinforced during transferring between processes or processing, so that the generation of cracks is suppressed.

On the other hand, conventionally, an electrostatic holding apparatus has been known as a holding apparatus being configured to hold a thin-film material such as a silicone wafer (see, for example, Patent documents 2, 3).

In such an electrostatic holding apparatus, a holding part is attached to a base plate, the holding part having a voltage controller being mainly constituted by an electrode element group configured to provide a pair of positive-negative charges and an insulating layer configured to cover and fix the electrode element group on the base plate and being configured to apply high voltage to the electrode element group and to discharge the applied voltage.

Thereby, by applying high voltage via the switches disposed on the voltage controller of these electrode element groups, a handling object is held by an electrostatic attraction force induced between the silicone wafer as the handling object and a surface of the insulating layer as a holding surface. When the switch is turned off, these electrostatic attraction forces are canceled and the handling object can be released. Thereby, the handling object such as a conductor, a semiconductor or a high resistive element is attracted by the electrostatic attraction force and held (loaded) and when being released, it functions as an electrostatic chuck configured to attach and detach (unloaded) the handling object.

[Patent Document 1] Japanese Patent Application Publication No. 2001-319906

[Patent Document 2] Japanese Patent Application Publication No. 2003-282671

[Patent Document 3] Japanese Patent Application Publication No. 2004-358562

[Patent Document 4] Japanese Patent Application Publication No. 2006-52075

DISCLOSURE OF INVENTION

Problem to be Solved by the Invention

In the semiconductor chip used in a recent thin film transistor (TFT), electrode patterns have been formed at both sides of the silicone wafer. In this case, for example, a silicone wafer having a surface dimension of about $\phi 3$ inch to $\phi 12$ inch and a thickness of about 650 μm is used. After a TFT pattern is formed on one side (front surface) of the silicone wafer, a rear surface from the surface where the TFT pattern is formed is polished. Thereby, total thickness of the silicone wafer is reduced to be about 30 μm to 80 μm to form a thin film silicone wafer. After then, in the thin film silicone wafer, the surface where the TFT pattern is formed is as a holding surface, and the TFT pattern is formed on the polished surface (rear surface) so that a thin film transistor TFT where the electrode patterns are formed at both sides is manufactured.

As described above, in a case where the electrode patterns are formed at both sides of a silicone wafer, if a protective tape is used as a reinforcement material, the protective tape is attached to the front surface where the TFT pattern is formed. However, since the protective tape uses an adhesive for the fixation, a releasing process (peeling process) for peeling the protective tape from the thin film silicone wafer after the forming process of the TFT pattern on the rear surface is required. In the peeling process, since the protective tape fixed by the adhesive is forcibly peeled from the silicone wafer, the stress is forced to be generated to the thin film silicone wafer. Accordingly, since a thickness of the thin film silicone wafer is small, there is a problem in that risk of generation of cracks is increased.

Here, even when the peeling device, as disclosed in the Patent Document, which can peel a protective tape without generating stress, is used, the risk of generating cracks remains. Furthermore, there is a problem in that the front surface where the fine TFT pattern is formed is polluted by the used adhesive. In the TFT pattern where the fine concaves and convexes are provided, generally, it is difficult to clean the TFT pattern surface polluted with the adhesive. In addition, there is a problem in that high cost of a cleaning liquid used for cleaning and high cost to discard, recycle, or the like the used protective tape, and the like are required.

An object of the present invention is to provide an electrostatic-type reinforcement apparatus configured to allow a reinforcement object of a thin plate material such as a silicone wafer, and the like to be attracted.

Means for Solving the Problem

In order to achieve the above object, an electrostatic-type reinforcement apparatus according to an embodiment of the present invention includes a reinforcement material body including a thin plate type electrostatic holding part formed by burying an electrode part into an electric insulating layer, and a voltage controller constituted to be separated from the reinforcement material body and having a first connecting terminal T1 configured to allow an reinforcement object conducted to an earth and a second connecting terminal T2 configured to allow the electrode part to be conducted to an earth or a high voltage. The voltage controller includes an attracting process part configured to attract the reinforcement object by generating an attraction force in the electrostatic holding part by applying a high voltage to the electrode part and supplying an electric charge of a reverse polarity to the voltage applied to the electrode part to the reinforcement object from the earth; and an attraction releasing process part configured to separate the reinforcement object by canceling an electrostatic attracting ability of the electrostatic holding part by releasing charges stored in the reinforcing object and the electrode part from the earth to be easily used as a function as a reinforcement material of the reinforcement material body.

According to such a configuration having the reinforcement material body including a thin plate type electrostatic reinforcement holding part formed by burying an electrode part in an electrostatic insulating layer, charges of reverse polarity to the charges applied to the electrode part can be supplied to the reinforcement object from the earth, so that the reinforcement object and the reinforcement material body can be strongly attracted to each other nu the charges of reverse polarities. Furthermore, thereby, even when the voltage controller is separately configured, the charges stored in the reinforcement object and the reinforcement material body are attracted to each other by the reverse polarities to each other so that the attraction force due to a static electricity can be maintained for a long time without being discharged to an outside.

DESCRIPTION OF NUMERALS

100: Wafer supporter (electrostatic-type reinforcement apparatus)
101: Wafer (reinforcement object)
110: Wafer supporter body (reinforcement material body)
112: Electrode part
112a: Through hole
112b: Connecting terminal
113: Electric insulating layer (polyimide layer)
114: Conductive base (electric field leakage preventing device)
114a: Through hole
114b: Connecting terminal (electrically-conductive device)
121: Connecting terminal (T1)
122: Connecting terminal (T2)
120: Voltage controller
SW1~SW4: Electric switches
R1: Electrical resistance

BEST MODE FOR CARRYING OUT THE INVENTION

Figure 1A:
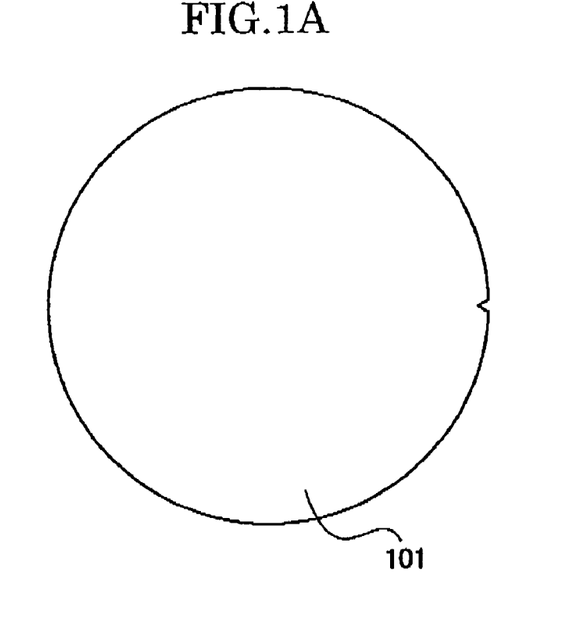
[FIG. 1A] A plain view of an electrostatic-type reinforcement apparatus showing an embodiment of the present invention.
Figure 1B:
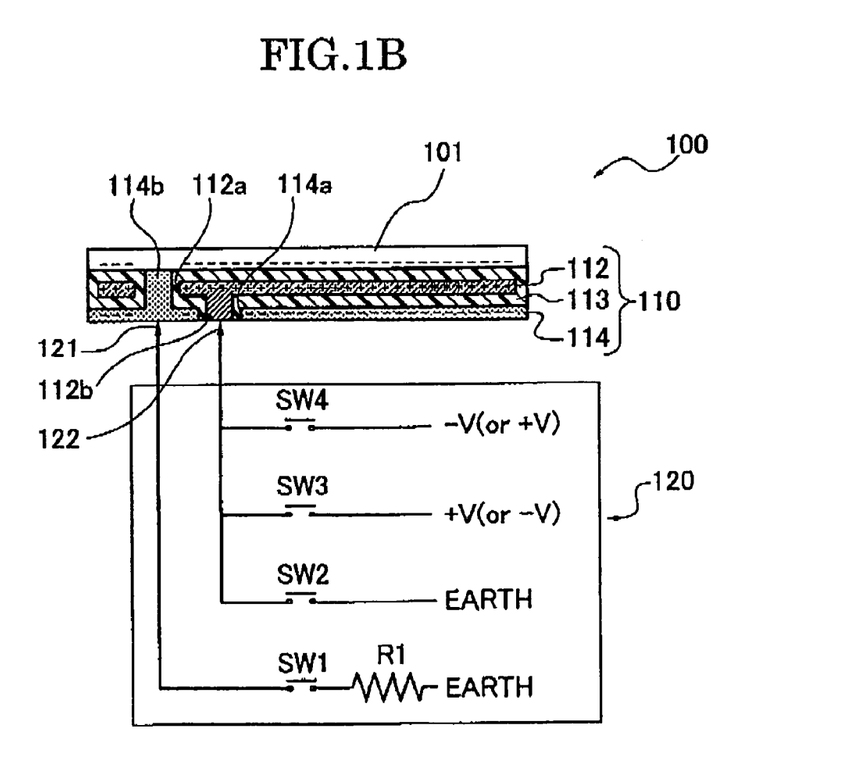
[FIG. 1B] A partially-sectional configuration diagram of an electrostatic-type reinforcement apparatus showing an embodiment of the present invention.
Figure 2:
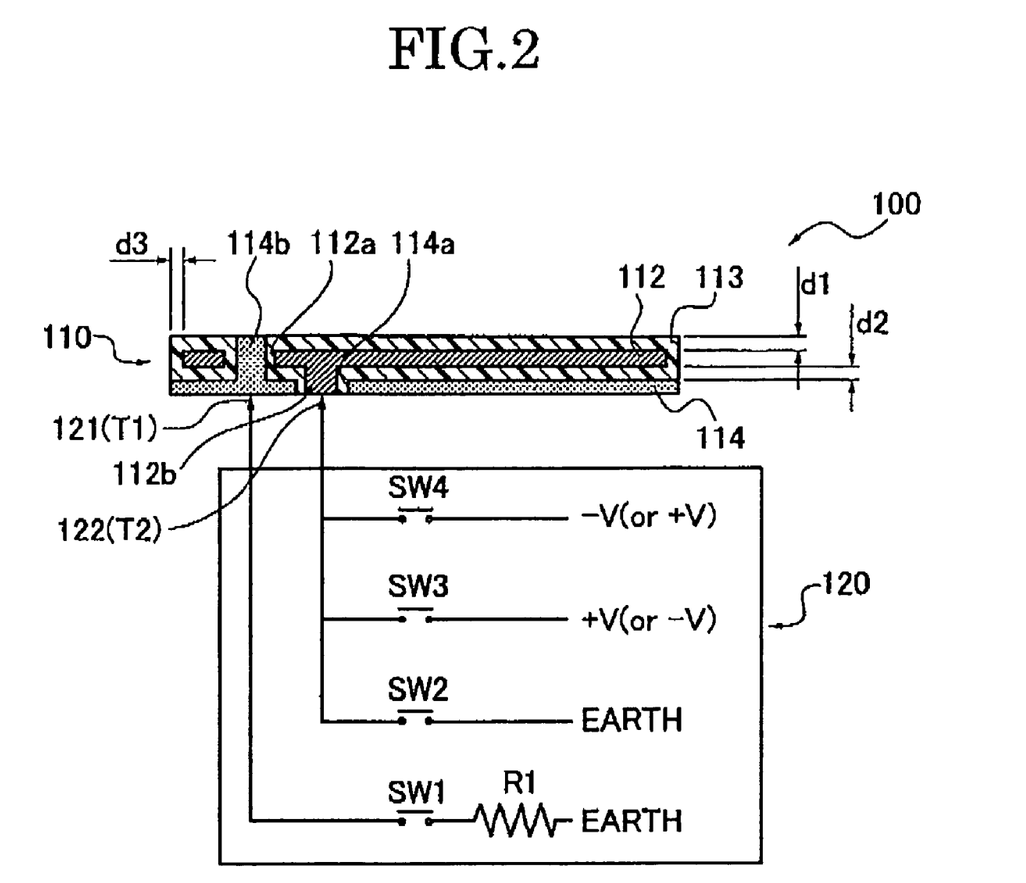
[FIG. 2] A partially-sectional configuration diagram of an electrostatic-type reinforcement apparatus according to the present invention.

Preferred embodiments of the present invention will be explained below with reference to the accompanying drawings. At first, FIG. 2 is a configuration diagram explaining an electrostatic-type reinforcement apparatus 100 according to an embodiment of the present invention, FIG. 1 is a configuration diagram explaining a state where a reinforcement object 101 is held by the electrostatic-type reinforcement apparatus 100 of FIG. 2. Any drawings are the configuration diagrams for explaining the configurations of the electrostatic-type reinforcement apparatus 100 according to the present invention in principle, and for example, the configuration is enlarged in a thickness direction in relation to a plane direction In FIG. 2, the electrostatic-type reinforcement apparatus 100 is a reinforcement material or a reinforcement apparatus for preventing occurrences of cracks or the like in a thin film-like reinforcement object such as a wafer during transferring or processing the reinforcement object. The electrostatic-type reinforcement apparatus 100 includes a reinforcement material body 110 as a thin plate type electrostatic holding part, and a voltage controller 120 separably constituted from the reinforcement material body 110. The voltage controller is configured to control voltages such that the reinforcement material body 110 provide an electrostatic attraction force when the reinforcement material body 110 functions as a reinforcement material and the electrostatic attraction force of the reinforcement material body 110 is canceled when use of the reinforcement material body 110 as the reinforcement material is terminated and the reinforcement material body 110 is returned.

Such a reinforcement material body 110 has a substantially same shape in a planer view as a reinforcement object 101 and an insulating layer 113 which cover an electrode part 112 and a periphery of the electrode part 112 to insulate them as mandatory configurations and in addition, a conductive base 114 in the electrostatic-type reinforcement apparatus 100 according to the present invention.

An outer shape of the electrode part 112 in a planar view is substantially equal to an outer shape of the reinforcement object 101 in a planar view. The electrode part 112 may have a comb shape, a lattice shape, or the like and it is preferable that the outer shape of the electrode part 112 in a planar view substantially coincides with the outer shape of the reinforcement object 101 in a planer view.

The electrode part 112 has, as shown in FIG. 2, two sides (d1, d2) and a periphery (d3) which are covered with the insulating layer 113 and, in the reinforcement material body 110 according to this embodiment, a thin film like conductive base 114 is fixed at a back side of the insulating layer 113.

Here, these insulating layers 113 are used for maintaining charges stored in the electrode part by insulating the charges applied to the electrode part.

Moreover, the conductive base 114 is an electric field leakage preventing device for stopping an electric field generated at a lower part of the electrode part 112 upon applying a voltage to the electrode part 112. Furthermore, the conductive base 114 of this embodiment also serves as an electrically-conductive device for allowing the voltage controller 120 to be structurally easily conducted to the reinforcement object 101 in order to easily discharge electric charges stored in the reinforcement object 101.

When the leakage of the electric field from the electrode part 112, or the like is negligible, the conductive base 114 provided at the back side opposite to the electrode part 112 may be omitted.

Furthermore, when the conductive base 114 is used as the electrically-conductive device, since it is necessary merely that the electric charge is smoothly discharged, high capacity of electrically conductivity is not always required. That is, low electrically conductivity which can be used at least for conducting electricity may be required.

The reinforcement material body 110 according to an embodiment of the present invention, having such a configuration, is intended to suppress an occurrence of cracks due to burden of stress on the reinforcement object and therefore the reinforcement material body 110. Accordingly, materials constituting the reinforcement material body 110, such as the electrode part 112, the insulating layer 113, and the conductive base 114, and the like are in an integrated state so as to have strength sufficient to withstand bending stress at least for protecting the reinforcement object 101 and it is also preferable that each material is formed as thinly as possible to the above extent.

Next, a through hole 114a is provided at a part of the conductive base 114 according to this embodiment. A part of the electrode part 112 passes through the through hole 114a and is exposed at the back side of the electrode part 112 which is covered with the insulating layer 113. The exposed part functions as a connecting terminal 112b connected to each of switches SW2 to SW4 of the later-described voltage controller 120.

Here, the connecting terminal 112b illustrated in FIGS. 1 and 2 is flush with the back side of the conductive base 114. However, if it is possible to connect to the connecting terminal of the voltage controller 120, it is not always necessary to be flush with each other. For example, the connecting terminal 112b may be provided in a concave or convex shape in relation to the conductive base 114. In addition, although, in this embodiment, the electrode part 112 passes through the conductive base 114 and is disposed at the back side, in the present invention, the electrode part 112 is merely required to be connected to and separated from the voltage controller 120 and therefore a position of the connecting terminal 112b is not limited to on the back side, and may be, for example, on a side surface.

On the other hand, in this embodiment, the through hole 112a is provided at a part of the electrode part 112. A part of the conductive base 114, which is covered with the insulating layer 113, passes through the through hole 112a and extends to the front side so that a connecting terminal 114b exposed at the front side is provided. This connecting terminal 114b is configured to contact with the reinforcement object 101 to equalize electric potential between the reinforcement object 101 and the conductive base 114 and therefore constitutes the electrically conductive device for removing electric charges of the reinforcement object 101 when the conductive base 114 is grounded. The connecting terminal 114b is preferably substantially flush with the front side of the insulating layer 113.

Next, the voltage controller 120 will be explained. The voltage controller 120 according to this embodiment includes four switches SW1 to SW4.

A connecting terminal 121 (a first connecting terminal T1) to the conductive base 114 is provided at an end of the switch SW1 and another end of the switch SW1 is grounded via a resistance R1.

One ends of the switches SW2 to SW4 are combined to provide a connecting terminal 122 (a second connecting terminal T2) and the connecting terminal 122 is connected to the connecting terminal 112b of the electrode part 112.

On the other hand, the other end of the switch SW2 is grounded. Furthermore, the other end of the switch SW3 is connected to a high-voltage power supply of +V (or −V) volt, and the other end of the switch SW4 is connected to a high-voltage power supply of −V (or +V) volt.

In addition, a switch control program is built in to the voltage controller 120, the switch control program being for allowing an attraction and separation between the reinforcement object 101 and the reinforcement material body 110 by Coulomb's force to be smoothly performed, according to an attracting process part of the reinforcement object in the later-described step 2 and an attraction releasing process part of the reinforcement object in a step 4.

Next, such a switch control program will be explained in detail together with an example of procedures of the attraction and separation operations of the reinforcement object.

(Step 1: Preparation Process)

In an initial setting, all of the switches SW1 to SW4 are turned off. AS shown in FIG. 1, the reinforcement object 101 is allowed to be in contact with the reinforcement material body 110 by putting the reinforcement object 101 on the reinforcement material body 110. Thereby, the reinforcement object 101 is electrically connected to the conductive base 114.

(Step 2: Attracting Process Part)

In a state where each of the switches SW1 to SW4 is turned off, the switch SW1 is turned on, and then the switch SW3 is turned on. Thereby, a high voltage +V (or −V) volt is applied to the electrode part 112 via the switch SW3. In relation to the voltage applied to the electrode part 112, a reverse charge to the applied voltage is supplied from the earth to the reinforcement object 101 and the conductive base 114 which are grounded via the switch SW1.

That is, when the voltage of +1 KV is applied to the electrode part 112, electric potential corresponding to −1 KV is supplied from the earth to surfaces of the reinforcement object 101 and the conductive base 114, facing the electrode part 112.

In such a state, potential difference is generated between the electrode part 112 and the reinforcement object 101 across the insulating layer 113 so that the Coulomb's force, by which the electrode part 112 and the reinforcement object 101 are attracted with each other, is generated. By the Coulomb's force, the reinforcement object 101 is attracted to the reinforcement material body 110.

The order of the switches SW1 and SW3 turning on may be reversed only to attract the reinforcement object by the Coulomb's force. However, if the switch SW1 is turned on after the switch SW3 is turned on, it is possible that a high current flows in the reinforcement object. Therefore, if there is a possibility that the reinforcement object such as a silicone wafer is broken by the current flow, firstly, the switch SW1 is turned on, and then the switch SW3 is turned on. Thereby, the possibility of breaking the reinforcement object 101 is decreased or reduced.

(Step 3: Separating Process of Voltage Controller)

Even if both of the connecting terminal 121 and the connecting terminal 122 are separated from the reinforcement material body 110 in a state where the reinforcement object 101 is attracted on the reinforcement material body 110 by the Coulomb's force, the electrode part 112 where a high positive potential of +V volt is maintained and the reinforcement object 101 where a high negative potential of −V volt is maintained are stuck to each other because stored electric charges of reverse polarities attracts each other. Accordingly, charges are not leaked to outside and a holding force is not decreased for a long time.

The reinforcement material body 110 provides a function effect as a replacement of a protective tape as a light thin plate supporting material. That is, a material constituting the reinforcement material body 110 has strength sufficient to withstand the bending stress at least for protecting the reinforcement object 101 so that the reinforcement material body 110 can function as a replacement of a protective tape.

Moreover, since the attraction force (Coulomb's force) according to this embodiment is not decreased or reduced for a long time even when the voltage controller 120 is separated, in a state where the reinforcement object 101 is held on the reinforcement material body 110 by the remaining Coulomb's force, an attraction surface and an opposite surface of the reinforcement object 101 can be processed.

(Step 4: Attraction Releasing Process Part of the Reinforcement Object)

After the necessary processes are completed, if the reinforcement material body 110 is separated from the reinforcement object, the voltage controller 120 is connected to the reinforcement material body 110. Then, if both of the switches SW1 and SW2 are turned on, charges charged in the electrode part 112, the reinforcement object and the conductive base 114 are discharged to the earth. Therefore, the holding force of the reinforcement material body 110 is decreased so that the reinforcement object 101 can be separated from the reinforcement material body 110.

The order of the switches SW1 and SW2 turning on is not limited thereto to separate the reinforcement object. However, if there is a possibility that the reinforcement object such as a silicon wafer is broken by the current flow, the order of turning-on the switches SW1 and SW2 is important to suppress high current flowing in the reinforcement object as much as possible.

For example, the switch SW1 is turned on so that the reinforcement object 101 is firstly grounded, and then the switch SW2 is turned on. Thereby, the high current at the beginning of discharging the charges of the reinforcement object 101 is prevented so that the possibility that the reinforcement object 101 is broken is decreased.

Furthermore, it is possible that the switch SW4 is turned on in a state where the switch SW1 is turned on and the reinforcement object 101 and the conductive base 114 are grounded, and high negative voltage may be applied to the electrode part 112 for a short time. Thereby, an internal polarization generated in the insulating layer 113 can be immediately canceled. After that, the switch SW2 is turned on and the electrode part 112 is grounded so that the Coulomb's force is canceled by discharging all charges in the reinforcement material body 110. Accordingly, the separation operation between the reinforcement material body 110 and the reinforcement object 101 can be smoothly performed.

EXPERIMENTAL EXAMPLE 1

Next, an example in which the electrostatic-type reinforcement apparatus 100 shown in FIG. 1 or 2 is used as a wafer supporter used in a manufacturing process of a silicone wafer will be explained with reference to a timing table of a voltage application shown in FIG. 3.

Here, the reinforcement object is a silicone wafer 101 and the reinforcement material body is referred to as a wafer supporter 110 in this experimental example.

In this wafer supporter 110, PI (polyimide) is selected as a material of the insulating layer 113. Both of an upper side thickness d1 of the polyimide layer 113 and a back side thickness d2 are substantially 75 μm and a lateral side thickness d3 is about 1 mm.

In addition, a voltage applied to the electrode part 112 via the switch SW3 is +1 KV (or −1 KV) and a voltage applied to the electrode part 112 via the switch SW4 is −1 KV (or +1 KV).

(Step 1: Preparation Process)

In a state where, as shown FIG. 1, the wafer 101, for example, a silicone wafer, or the like, as the reinforcement object is put on the wafer supporter 110 as the reinforcement material body, the wafer 101 is allowed to be in contact with the connecting terminal 114b of the conductive base 114 to electrically connect between the wafer 101 and the conductive base 114.

(Step 2: Attracting Operation of the Reinforcement Object)

Figure 3:
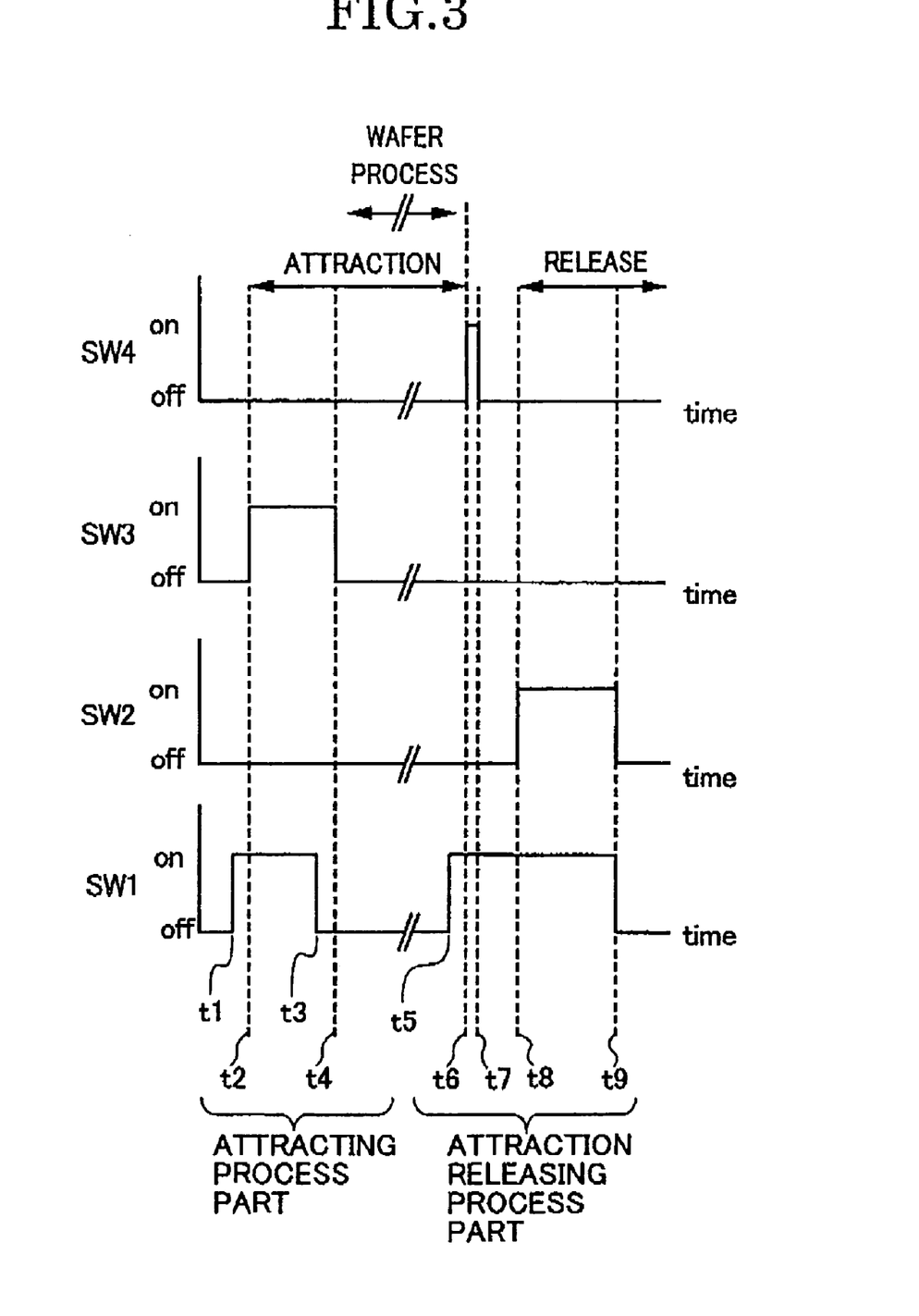
[FIG. 3] An operation timing chart of the electrostatic-type reinforcement apparatus showing in FIG. 1A and FIG. 1B.

Next, in such a state, as shown in FIG. 3, SW1 is turned on at a first timing t1 and both of the conductive base 114 and the wafer 101 are grounded.

Then, SW3 is turned on at a timing t2 after the switch SW1 is turned on, and a voltage of +1 KV is applied to the electrode part 112. With the voltage application to the electrode part 112, charges of reverse polarity to the applied voltage are attracted from an earth on the surfaces of the wafer 101 and the conductive base 114 and potential difference is generated between the electrode part 112 and the wafer 101 so that attraction force is generated.

The timings t1 and t2 may be reversed for attraction. However, when the reinforcement apparatus is used for a semiconductor wafer, the timings are important to prevent high current flow in the semiconductor wafer.

The switch SW 1 is turned off at a timing t3 when changes sufficient for the high voltage of +1 KV applied to the electrode part 112 are stored in the wafer 101 and the conductive base 114. Thereby, the earth of the conductive base 114 conducted to the wafer 101 is released and the charge flows stored in the conductive base 114 and the wafer 101 are stopped. Moreover, at the same time, charges stored in the conductive base 114 and the wafer 101 are stuck by the charges of the reverse polarity of the electrode part 112.

At a timing t4 after that, the switch SW3 is turned off so that electrical power supply for the electrode part 112 is cutoff. In such a state, even when the voltage controller 120 is separated from the wafer supporter 110, both a path where the charge of +V volt stored in the electrode part flows off and a path where the charges of −V volt stored in the conductive base 114 and the wafer 101 flow off are cutoff and also charges of reverse polarity, which are stored in the wafer 101 and the electrode part 112 attract each other across the insulating layer 113 so that the stored charges are not leaked to an outside to maintain the attraction force for a long time.

Here, the order of the timings t3 and t4 is important. When the order is reversed, the attraction can be performed but, if the timing t4 is performed before t3, the charges of −V volt being stored in the conductive base 114 and the wafer 101 are discharged and therefore the attraction force is reduced.

In addition, the timings t3 and t4 may be the same timing in a strict sense, but t4 is preferably performed after t3 considering erroneous operation, or the like.

Then, the voltage controller 120 is separated off from the wafer supporter body 110.

Here, in the apparatus shown in FIG. 1, the mutually attraction force is not decreased for 12 hours when the applied voltage to the electrode part 112 is +1 KV, it can be founded that the holding force of 7 Kgf in a direction perpendicular to an attraction surface of a 6-inch wafer is maintained. The holding force is necessary and sufficient to fix a thin wafer to the wafer supporter.

By use of this holding force, the thin wafer is closely attached to the wafer supporter 110 to function as a reinforcement material and to perform transferring, processing and the like the thin wafer 101.

Next, operations of separating the wafer supporter 110 from the wafer 101 will be explained.

The switch SW1 is turned on at a timing t6 of FIG. 3 and again the wafer 101 is grounded together with the conductive base 114. Then, the switch SW4 is turned on at a timing t6 so that the voltage of reverse polarity to the voltage, which is applied from the switch SW3 at the timing t2, is applied to the electrode part 112. Here, in this embodiment, although the polarities are reverse to each other, the voltages equal to each other are applied. Therefore, the polarity of the voltage supplied from the switch SW4 is opposite, but it is not necessary to limit the voltages equal to each other.

The application of the voltage is used with a long time holding, for canceling an internal polarization of the insulating layer 113 due to a presence of the electric field between the electrode part 112 and the wafer 101 for a long time and performing separation off operation at a later timing t8 without remaining force. That is, the reverse electric field to the electric field during holding is applied to the insulating layer 113 to cancel the internal polarization. Therefore, an interval between the timings t6 and t7 may be short, for example, about two seconds are sufficient.

After the internal polarization is canceled, the switch SW4 is turned off at a timing t7 and after that, the switch SW2 is turned on at a timing t8 to ground the electrode part 112. At this time, the electrode part 112, the wafer 101, and the conductive base 114 are grounded and the stored charges flow to a ground so that potential difference between the electrode part 112 and the wafer 101 is eliminated to cancel the attraction force between the wafer 101 and the wafer supporter 110. Thereby, the wafer 101 can be easily separated from the wafer supporter 110.

In addition, electrical resistance R1 of FIG. 1 is provided to suppress the current of the charges flowing into the wafer from a ground when starting the attraction or of the charges flowing off from the wafer to the ground when separation, to be small. This is because the resistance value is selected in accordance with a maximum allowable current of a TFT on the wafer.

Furthermore, the application of the voltage to the electrode part 112 when turning on SW4 is an operation to cancel the internal polarization of the insulating layer with a long time attraction holding and therefore, it is preferable that the control of SW4 to be turned on is included. However, in a case where it is not necessary to cancel the internal polarization, for example, where a long time holding is not performed, or the like, or in a case where the remaining holding force is negligible when separation, it can be omitted to control the timings t6 and t7.

In addition, the presence of the conductive base 114 is for stopping the electric field generated at a lower part from the electrode part 112 and therefore basically, it does not affect the holding force. If the leakage of the electric field is negligible, the conductive base 114 may be omitted.

MODIFIED EXAMPLE 1

Figure 4A:
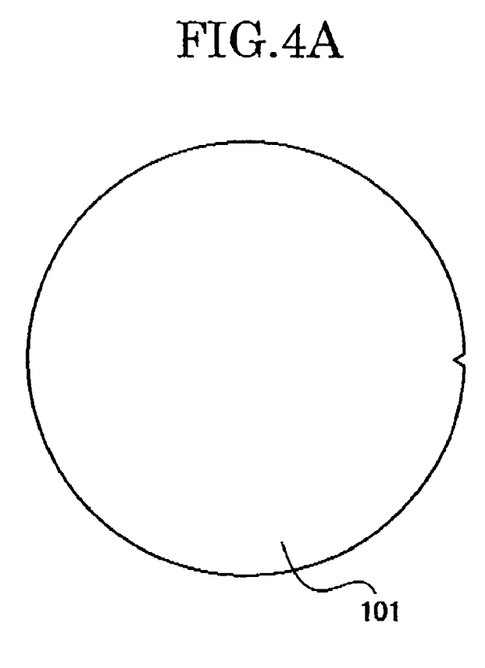
[FIG. 4A] A plain view of an electrostatic-type reinforcement apparatus showing a modified example of the present invention.
Figure 4B:
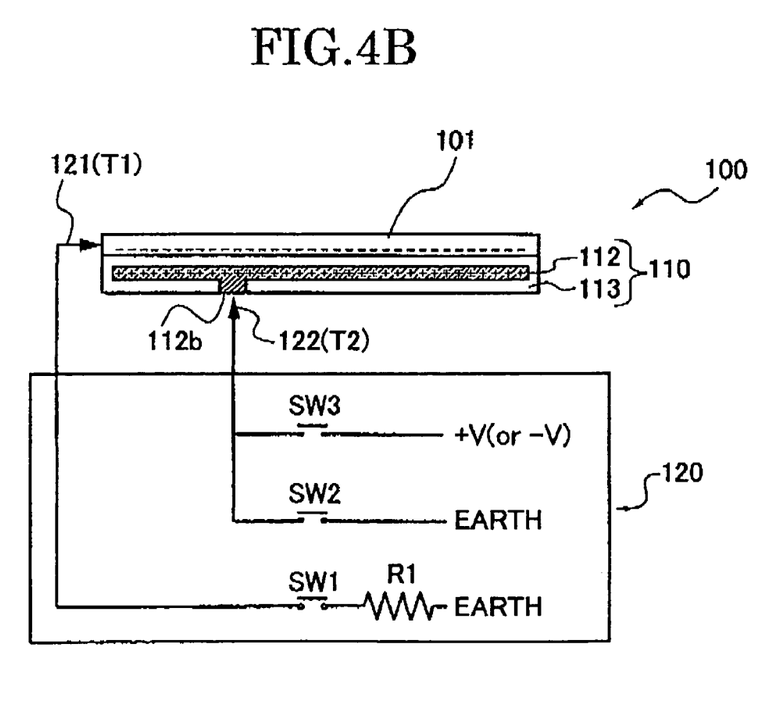
[FIG. 4B] A partially-sectional configuration diagram of an electrostatic-type reinforcement apparatus showing a modified example of the present invention.
Figure 5:
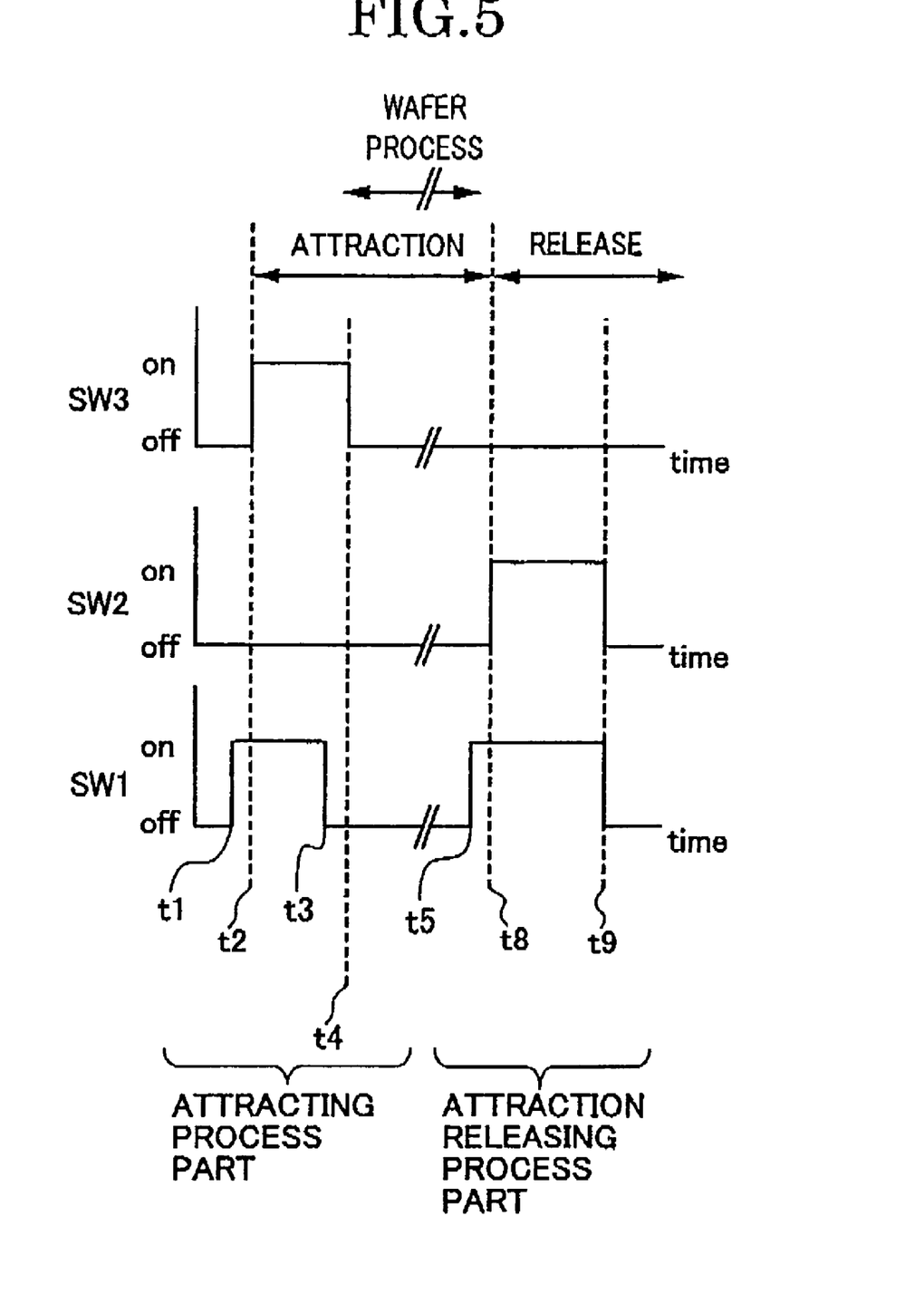
[FIG. 5] An operation timing chart of the electrostatic-type reinforcement apparatus showing in FIG. 1A and FIG. 1B or FIG. 4A and FIG. 4B.

The electrostatic-type reinforcement apparatus 100 according to a modified example 1 is shown in FIG. 4 and an example of the control has a voltage application timing table shown in FIG. 5.

In FIG. 4, although the same numbers are used for same or equivalent parts or members to those of the electrostatic-type reinforcement apparatus shown in FIG. 1 and detailed explanation is omitted. In relation to the electrostatic-type reinforcement apparatus of FIG. 1, the conductive base 114 and the switch SW4 is omitted in the electrostatic-type reinforcement apparatus. Thereby, the connecting terminal 114b provided in the reinforcement material body 110 using the conductive base 114 is omitted, and the connecting terminal 121 (T1) is configured to be directly contacted with the reinforcement object 101.

Furthermore, the presence of the conductive base 114 is for stopping the electric field generated at a lower part 112 from the electrode part 112 and therefore does not affect the holding force. If the leakage of the electric field is negligible, as shown in FIG. 4, it is possible to remove the conductive base 114 and directly ground only the wafer 101 via SW1.

In addition, the connecting terminal 121 (T1) is a contact point for discharging the charges stored in the reinforcement object and therefore, if directly connected to the voltage controller 120, equivalent function can be provided.

However, as shown in FIG. 1, it is preferable that the connecting terminal 112b is led to a side of the reinforcement material body 110 in order that the voltage controller is easily configured.

In addition, as described above, the switch SW4 is not necessary and thereby it can be used as the electrostatic-type reinforcement apparatus by the timing table shown in FIG. 5.

(Step1: Preparation Step)

As shown in FIG. 4, in a state where the reinforcement object 101 is put on the reinforcement material body 110, the reinforcement object 101 is connected to the connecting terminal 121(T1) of the voltage controller 120.

(Step2: Attracting Operation of the Reinforcement Object)

In this state, as shown in FIG. 5, SW1 is turned on at the first timing t1 to ground the reinforcement object 101.

Next, SW3 is turned on at the timing t2 after the switch SW1 is turned on to apply a high positive voltage to the electrode part 112. With voltage application to the electrode part 112, the reinforcement object 101 attracts the charges of reverse polarization from the ground, and the potential difference is generated between the electrode part 112 and the reinforcement object 101 to generate the attraction force.

The timings t1 and t2 may be reversed to perform attraction, but in a case where it is used as the reinforcement apparatus of a semiconductor wafer, and the like, the timings are important to prevent high current flow in the semiconductor wafer.

SW1 is turned off at the timing t3 where the charges sufficient for the high voltage applied to the electrode part 112 are stored in the reinforcement object 101. Thereby, the earth (ground) of the reinforcement object 101 is released and the flow of the charges stored in the reinforcement object 101 is stopped. Furthermore, at the same time, the charges stored in the reinforcement object 101 are stuck by the reverse polarity charges of the electrode part 112.

At the following timing t4, SW3 is turned off to stop the electrical power supply for the electrode part 112. In this state, even if the voltage controller 120 is separated from the reinforcement material body 110, both of a path where the positive charges stored in the electrode part flow off and a path where the negative charges stored in the reinforcement object 101 flow off are stopped and the charges of reverse polarity being stored in the reinforcement object 101 and the electrode part 112 attract each other across the insulating layer 113. Accordingly, the stored charges are not leaked to outside so that the attraction force is maintained for a long time.

Here, the order of the timings t3 and t4 is important. Although when the timings are reversed, the attraction can also be performed, if the t4 is performed before t3, the negative charges stored in the reinforcement object 101 are partially discharged so that the attraction force is decreased.

Moreover, the timings t3 and t4 may be the same timing in a strict sense, but considering erroneous operations and the like, it is preferable to perform t4 after t3.

Then, the voltage controller 120 is separated from the wafer supporter body 110.

By using this holding force, the reinforcement object is closely attached to the reinforcement material body 110 so that even thin material can be operated, for example, transferred, processed, or the like.

Next, operations for separating the reinforcement material body 110 from the reinforcement object 101 will be explained.

The switch SW1 is turned on at the timing t5 of FIG. 5, and again, the reinforcement object 101 is grounded. Then, the switch SW2 is turned on at the timing t8 to ground the electrode part 112. At this time, both of the electrode part 112 and the reinforcement object 101 are grounded the stored charges flow to the ground, the potential difference between the electrode part 112 and the reinforcement object 101 are dissipated so that the attraction force between the reinforcement object 101 and the reinforcement material body 110 is dissipated. Thereby, the separation (or peeling) between the reinforcement object 101 and the reinforcement material body 110 is easily performed.

EFFECTS OF INVENTION

According to the present invention, it is possible to provide a reinforcement material capable of suppressing the generation of stress on the reinforcement object in separation as much as possible without grimes due to an adhesive agent.

Furthermore, the reinforcement material according to the present invention is preferably used as a reinforcement material of a silicone wafer having two sides to be processed because the generation of stress in separation can be suppressed as much as possible without grimes due to an adhesive agent.

The reinforcement object which is applicable to the above-described electrostatic-type reinforcement apparatus according to the present invention is not limited to a wafer and can function as a reinforcement holding plate of other conductive to low conductive thin plates.

In addition, the above-explained reinforcement apparatus can be particularly effectively used as a reinforcement material of a silicone wafer in a case where electrode patterns are formed on both sides of a thin-film transistor (TFT) is processed because of no grime due to an adhesive agent.

The invention claimed is:

1. An electrostatic-type reinforcement apparatus, comprising
    a reinforcement material body including a thin plate type electrostatic holding part formed by burying an electrode part into an electric insulating layer; and
    a voltage controller constituted to be separated from the reinforcement material body and having a first connecting terminal configured to allow an reinforcement object conducted to an earth and a second connecting terminal configured to allow the electrode part to be conducted to an earth or a high voltage,
    wherein the voltage controller includes
        an attracting process part configured to attract the reinforcement object by generating an attraction force in the electrostatic holding part by applying a high voltage to the electrode part and supplying an electric charge of a reverse polarity to the voltage applied to the electrode part to the reinforcement object from the earth;
        an attraction releasing process part configured to separate the reinforcement object by canceling an electrostatic attracting ability of the electrostatic holding part by releasing charges stored in the reinforcing object and the electrode part from the earth;
        a first switch SW1 configured to control a continuity between the reinforcement object and the earth;
        a second switch SW2 configured to control a continuity between the electrode part and the earth; and
        a third switch SW3 configured to control a high voltage applied to the electrode part;
    all of the switches SW1 to SW3 are turned off in an initial setting;
    the switch SW3 is turned on after the switch SW1 is turned on, and then the switches SW1, SW3 are sequentially turned off in the attracting process part; and
    the switch SW2 is turned on after the switch SW1 is turned on in the attraction releasing process part.

2. The electrostatic-type reinforcement apparatus according to claim 1, wherein
    the voltage controller further includes a fourth switch SW4 configured to control a high voltage of a reverse polarity to the voltage applied by the switch SW3, to be applied to the electrode part;
    all of the switches SW1 to SW4 are turned off in the initial setting; and
    the switch SW1 is turned on, the switch SW4 is turned on, and the switch SW2 is turned on, in series in the attraction releasing process part.

3. The electrostatic-type reinforcement apparatus according to claim 1, wherein the reinforcement material body includes an electrically-conductive device configured to allow the connecting terminal to the switch SW1 to be electrically conducted to the reinforcement object.

4. The electrostatic-type reinforcement apparatus according to claim 1, wherein the reinforcement material body includes an electric field leakage preventing device configured to prevent leakage of an electric field from the reinforcement material body to outside at a back side of the reinforcing material body.

5. The electrostatic-type reinforcement apparatus according to claim 1, wherein the reinforcement object is a wafer.

6. The electrostatic-type reinforcement apparatus according to claim 1, wherein the reinforcement object is an electrically conductive thin plate.

* * * * *